(12) United States Patent
Dewers et al.

(10) Patent No.: US 11,294,349 B1
(45) Date of Patent: Apr. 5, 2022

(54) INJECTION WITHDRAWAL TRACER TESTS TO ASSESS PROPPANT PLACEMENT

(71) Applicant: National Technology & Engineering Solutions of Sandia, LLC, Albuquerque, NM (US)

(72) Inventors: Thomas Dewers, Albuquerque, NM (US); Patrick V. Brady, Sandia Park, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 319 days.

(21) Appl. No.: 16/017,712

(22) Filed: Jun. 25, 2018

Related U.S. Application Data

(62) Division of application No. 13/207,734, filed on Aug. 11, 2011, now abandoned.

(51) Int. Cl.
*E21B 43/16* (2006.01)
*G06F 30/20* (2020.01)
*G05B 19/406* (2006.01)

(52) U.S. Cl.
CPC ............ *G05B 19/406* (2013.01); *E21B 43/16* (2013.01); *G06F 30/20* (2020.01); *G05B 2219/40585* (2013.01)

(58) Field of Classification Search
CPC ........ G05B 19/406; G05B 2219/40585; G06F 30/20; E21B 43/16
See application file for complete search history.

(56) References Cited

U.S. PATENT DOCUMENTS

| | | | |
|---|---|---|---|
| 4,278,128 A * | 7/1981 | Satter | E21B 49/00 166/250.16 |
| 4,493,999 A | 1/1985 | Catchen | |
| 5,049,743 A * | 9/1991 | Taylor, III | E21B 43/26 250/260 |
| 5,196,124 A | 3/1993 | Connor et al. | |
| 7,472,748 B2 | 1/2009 | Gdanski et al. | |
| 9,290,689 B2 * | 3/2016 | Lafitte | C09K 8/62 |
| 2003/0163259 A1 | 8/2003 | DiFoggio et al. | |
| 2003/0196800 A1 | 10/2003 | Nguyen et al. | |
| 2005/0252286 A1 | 11/2005 | Ibrahim et al. | |

(Continued)

OTHER PUBLICATIONS

Gardien et al. "Hydraulic Fracture Diagnosis Using Chemical Tracers" SPE 36675, Society of Petroleum Engineers [retrieved on May 6, 2021]. Retrieved from OnePetro.org. (Year: 1998).*

(Continued)

*Primary Examiner* — Rehana Perveen
*Assistant Examiner* — Alfred H B Wechselberger
(74) *Attorney, Agent, or Firm* — Daniel J. Jenkins

(57) ABSTRACT

Placement of proppant in subterranean formations during hydraulic fracturing is assessed. A method of one aspect includes introducing a hydraulic fracturing fluid including a proppant into a subterranean formation through a well. Samples of the hydraulic fracturing fluid are recovered through the well over a period of time. A concentration of at least one tracer in each of the samples is determined. The concentrations of the at least one tracer in the samples are analyzed to assess placement of the proppant in the subterranean formation. Other methods, apparatus, and systems are also disclosed.

6 Claims, 8 Drawing Sheets

(56) References Cited

U.S. PATENT DOCUMENTS

| | | | |
|---|---|---|---|
| 2006/0052251 A1* | 3/2006 | Anderson | E21B 47/11 |
| | | | 507/103 |
| 2007/0214878 A1 | 9/2007 | Anderson | |
| 2008/0183451 A1* | 7/2008 | Weng | E21B 43/26 |
| | | | 703/10 |
| 2009/0061082 A1 | 3/2009 | Swearingen et al. | |
| 2009/0272528 A1 | 11/2009 | Voelker | |
| 2009/0277630 A1* | 11/2009 | McDaniel | G01V 3/30 |
| | | | 166/250.1 |
| 2009/0288820 A1 | 11/2009 | Barron et al. | |
| 2011/0257944 A1* | 10/2011 | Du | E21B 43/267 |
| | | | 703/2 |
| 2012/0073811 A1* | 3/2012 | Mock | C10G 25/003 |
| | | | 166/279 |
| 2013/0341012 A1* | 12/2013 | Belani | E21B 47/11 |
| | | | 166/250.12 |

OTHER PUBLICATIONS

"Sorb" [website] Collins Online English Dictionary [retrieved on May 6, 2021]. Retrieved from <https://www.collinsdictionary.com/us/dictionary/english/sorb> (Year: 2021).*

Duenckel et al. "Field Application of a New Proppant Detection Technology" SPE 146744, Society of Petroleum Engineers [retrieved on Nov. 15, 2011] (Year: 2011).*

* cited by examiner

INJECTION WITHDRAWAL TRACER TESTS TO ASSESS PROPPANT PLACEMENT

RELATED APPLICATIONS

This application is a divisional application of U.S. Ser. No. 13/207,734, filed Aug. 11, 2011 and entitled "INJECTION WITHDRAWAL TRACER TESTS TO ASSESS PROPPANT PLACEMENT." The present application claims the priority of its parent application, which is incorporated herein by reference in its entirety.

STATEMENT OF GOVERNMENT RIGHTS

This invention was developed under Contract DE-AC04-94AL85000 between Sandia Corporation and the U.S. Department of Energy. The U.S. Government has certain rights in this invention.

BACKGROUND

Field

Embodiments of the invention relate generally to hydraulic fracturing of subterranean formations, and more particularly to assessing placement of proppant used for hydraulic fracturing.

Background Information

Natural gas, oil, hydrocarbons, water, geothermal water, and other resources are contained in, and recovered from, subterranean or underground formations. To access these resources, wells are typically drilled from the surface down into the subterranean formations and the resources are recovered through the wells. Stimulation techniques are commonly used to enhance or stimulate the recovery of these resources.

Hydraulic fracturing (also known as hydrofracing or fracing) is one known stimulation technique. Hydraulic fracturing may help to improve the productivity of a well and/or the recovery of natural gas, oil, water, or other resources from a subterranean rock or reservoir formation by creating or extending fractures (e.g., fissures, cracks, breakage, cleavage, etc.) from the wellbore into the subterranean formation. Hydraulic fracturing typically involves pumping, hydraulically injecting, or otherwise introducing a hydraulic fracturing fluid through the wellbore into the subterranean formation at rates and pressures sufficient to create, extend, or enlarge fractures in the subterranean formation (e.g., to extend fractures in the strata of sedimentary rocks).

FIG. 1 is cross-sectional side view illustrating an example of a prior art hydraulic fracturing procedure. A well 101 resides on a surface 102 of the earth 100. A wellbore 103 extends from the well into the subterranean or underground formation 104 typically far beneath the surface. The subterranean formation may be, for example, sedimentary rock, shale, coal, siltstone, chalk, limestone, dolomite, diatomite, or other typically low permeability portion of the earth having natural gas, oil, water, or other natural resources. It is not uncommon for the subterranean formation to be thousands of feet beneath the surface. During hydraulic fracturing, hydraulic fracturing equipment 105 is used to pump, inject, or otherwise introduce a hydraulic fracturing fluid 106 through the well into the wellbore and down into the subterranean formation. Without limitation, the hydraulic fracturing equipment 105 may include a high-pressure pump, a slurry blender or mixer, storage tanks or trucks, chemical additive units, or some combination thereof. The hydraulic fracturing fluid may be introduced at a rate and pressure sufficient to create, extend, or enlarge fractures 107 in the subterranean formation. The fracturing is often done separately in multiple stages 108A-D along a horizontal segment of the wellbore. In the illustration, a horizontal fracturing operation is shown, although alternatively a vertical fracturing operation could be performed.

A proppant is typically utilized during the hydraulic fracturing in order to "prop" the fractures open. The proppant typically represents a finely divided solid or particulate material, such as, for example, sand, ceramic particles, etc. The proppant may be included in the hydraulic fracturing fluid that is injected into the well. The proppant may enter the fractures along with the hydraulic fracturing fluid and may remain in the fractures after the hydraulic fracturing treatment has ended. As the name implies, the proppant may help to "prop" open the fractures (e.g., hold the fractures at least partially open) once the high pressures associated with the hydraulic fracturing have been removed. Without the proppant, the fractures may tend to close once the high pressures associated with the hydraulic fracturing operation no longer exist, thereby diminishing the benefit of the hydraulic fracturing.

FIG. 2 is a cross-sectional side view illustrating a prior art arrangement of proppant 210 disposed within a fracture 207 to prop or hold the fracture open. The fracture is created in rock 211. The fracture represents a void or opening defined between upper and lower (as illustrated) walls 212 of the rock. The proppant is lodged or disposed between the walls of the fracture. Representatively, the proppant may represent particles of sand, ceramic particles, or other finely divided or particulate solid materials. The presence of the proppant helps to keep the fracture from closing, or at least closing completely.

The fractures held open by the proppant may provide conductive paths or permeable channels through which the natural gas or other fluid natural resource may be recovered more effectively from the subterranean formation. The natural gas or other fluid resource may enter the fractures, may flow through the fractures into the wellbore, and may be conveyed through the wellbore up to the surface where they may be recovered. Advantageously, the fractures bearing the proppant may help to increase production rates and/or the amount of recoverable resource.

The amount of stimulation provided by hydraulic fracturing therefore depends to a large extent upon the ability to generate (e.g., create and/or extend) fractures and the ability to retain the fractures through appropriate placement of the proppant. Without appropriate placement of the proppant, fractures generated during the hydraulic fracturing may tend to close, thereby diminishing the benefits of the hydraulic fracturing. However, in practice it tends to be challenging to assess the placement of proppant within fractures.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Disclosed herein are new methods, apparatus, systems, compositions, and approaches that are useful to help assess placement of proppant within fractures formed in subterranean formations by hydraulic fracturing. In some embodiments, a tracer chemical (i.e., a tracer), and a proppant that is operable to sorb, retain, delay, bind, desorb, release, release over time, or otherwise relatively strongly physicochemically interact with the tracer, are used during hydraulic fracturing in order to help assess placement of the proppant. After placing the proppant during hydraulic fracturing, the hydraulic fracturing fluid may be withdrawn or recovered from the well and samples thereof may be taken and analyzed. Concentrations of tracer in the analyzed samples may depend upon and reflect both the interactions between the proppant and the tracer as well as the placement of the proppant within the subterranean formation. Analysis of these concentrations may thereby be used to assess the placement of the proppant. Advantageously, the information about the placement of the proppant may help to provide information about, and/or a better understanding of, resource recovery from the hydrofractured well (e.g., whether or not poor production is attributable to poor proppant placement), and/or may help to provide information about, and/or a better understanding of, the hydrofracturing process, which may help to improve proppant placement.

Figure 1:
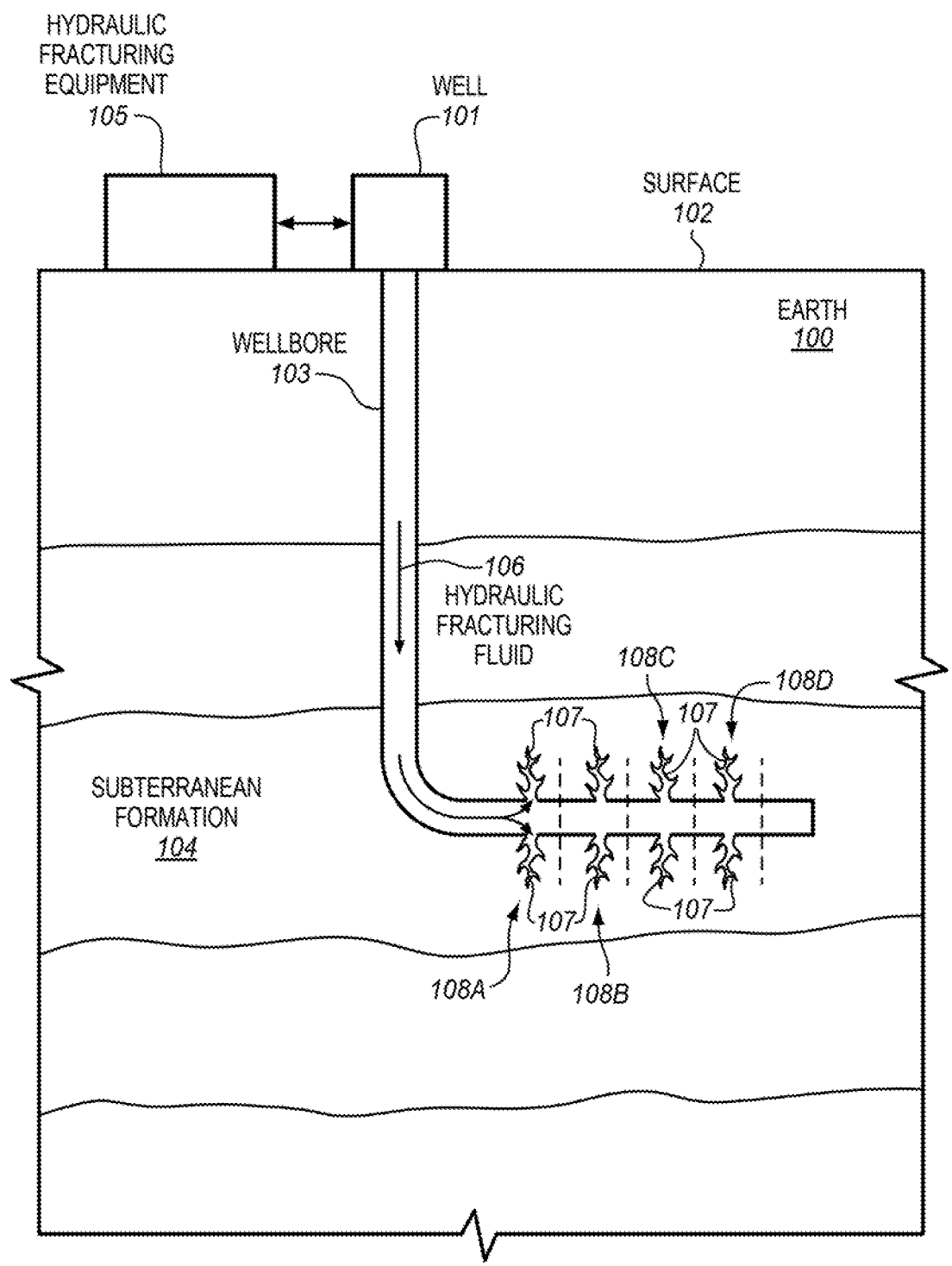
FIG. 1 is cross-sectional side view illustrating an example of a prior art hydraulic fracturing procedure.
Figure 2:
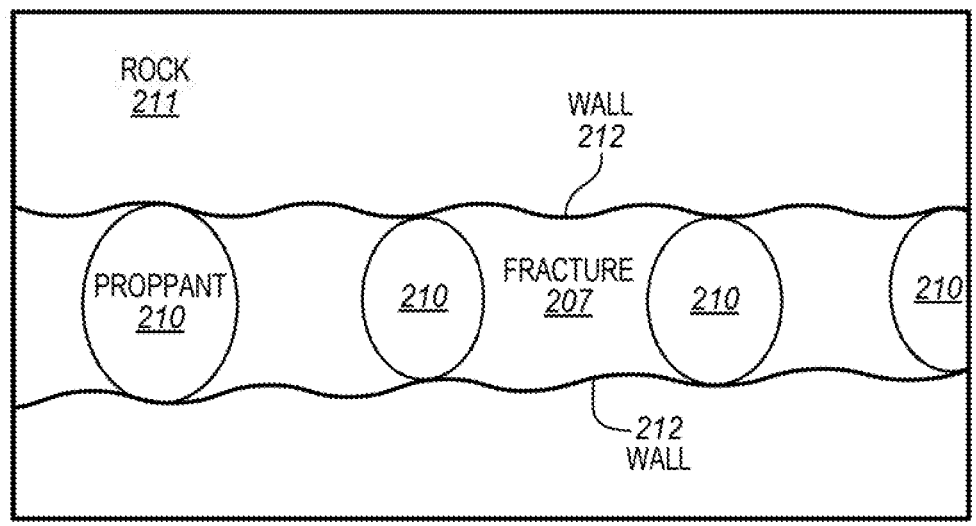
FIG. 2 is a cross-sectional side view illustrating a prior art arrangement of proppant disposed within a fracture to prop or hold the fracture open.
Figure 3:
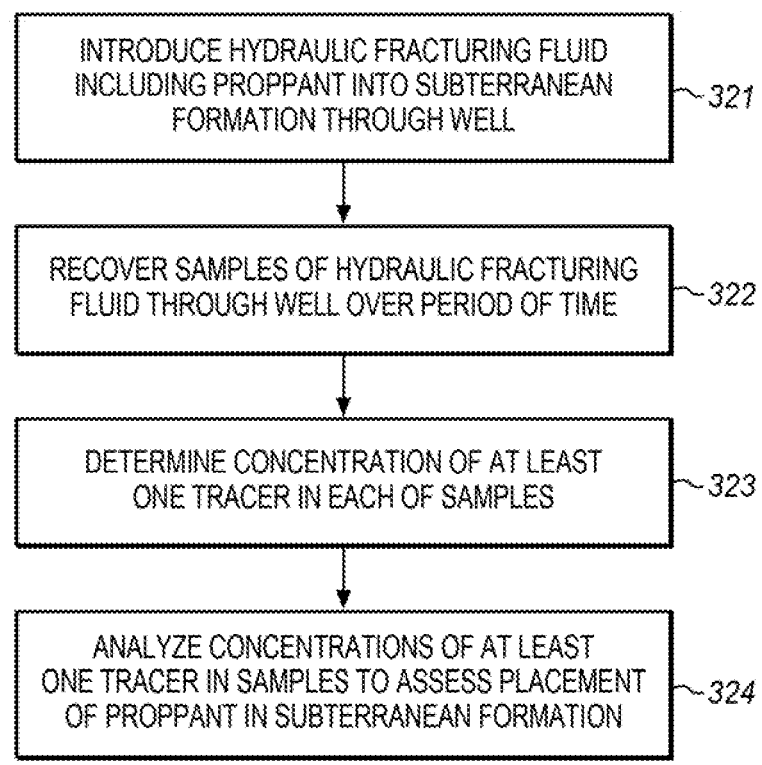
FIG. 3 is a block flow diagram of an example embodiment of a method of assessing proppant placement in a subterranean formation.

FIG. 3 is a block flow diagram of an example embodiment of a method 320 of assessing proppant placement in a subterranean formation. In some embodiments, the method may represent a single-well injection-withdrawal tracer test where the injection-withdrawal operations correspond to those of a hydraulic fracturing operation. The injection and withdrawal may be performed using the same single well. Single-well injection-withdrawal is also referred to in the arts as "huff-and-puff," "push-pull," and "injection-backflow." In other embodiments, the method may be performed in conjunction with cross-well injection-withdrawal. In some embodiments, the method may be performed during a completion diagnostic phase making use of injection and backflow operations typically performed during hydraulic fracturing. The method may be used for multizone, horizontal completion as well as for vertical wellbores.

The method includes introducing a hydraulic fracturing fluid including a proppant into a subterranean formation through a well, at block 321. The hydraulic fracturing fluid may be introduced into the subterranean formation at a pressure and rate sufficient to generate fractures in the subterranean formation, as previously described. In addition to generating the fractures, the hydraulic fracturing fluid should transport the proppant into and preferably along a length of the generated fractures to form porous propped fractures of appropriate length.

Various different embodiments of suitable hydraulic fracturing fluids are contemplated. Hydraulic fracturing fluids suitable for embodiments may be of any composition, quantity, pressure, flow rate, and other properties that are known in the art as suitable for use in a fracturing operation. A few representative examples of suitable hydraulic fracturing fluids include, but are not limited to, aqueous solutions, aqueous gels, viscoelastic surfactant gels, gels, heavy brines, emulsions, drilling fluids, oil gels, and combinations thereof. Commonly, a vast majority of the hydraulic fracturing fluid (e.g., 96-98%, or more) is water plus proppant. The remainder may include one or more, or often a combination, of various different types of additives. Examples of suitable additives include, but are not limited to, acids, corrosion inhibitors, iron control agents, anti-bacterial agents (e.g., glutaraldehyde), scale inhibitors (e.g., ethylene glycol), clay stabilizers, friction reducers (e.g., petroleum distillates), surfactants, gelling agents, viscosity increasing agents (e.g., isopropanol), breakers, thickeners (e.g., guar gum), crosslinkers, pH adjusters, etc. In some embodiments, the hydraulic fracturing fluid may include a tracer, as described further below.

Proppant is included in the hydraulic fracturing fluid. Various different embodiments of suitable proppants are contemplated. Proppant suitable for embodiments may be of any material, size, and shape combination that is known in the art as suitable for use in a fracturing operation, as long as at least a portion of the proppant is able to interact with the tracer as described elsewhere herein. A few representative examples of suitable proppants include, but are not limited to, sand, graded sand, resin coated sand, ceramic proppants (e.g., ceramic particles), bauxite, sintered bauxite, glass particles, deformable proppants, and the like, and combinations thereof. A few representative examples of suitable deformable proppants include, but are not limited to, crushed or ground shells of nuts (e.g., walnut, pecan, etc.), wood particles, polymeric beads, and the like, and combinations thereof. Commonly, the proppant has a size in the range of from about 2 to about 400 mesh, or from about 8 to about 120 mesh, U.S. Sieve Series. The proppants may be spherical, sphereoidal, non-sphereoidal, or a combination thereof.

In some embodiments, a tracer may be introduced into the subterranean formation through the well along with the hydraulic fracturing fluid and/or proppant, at block 321. A few representative examples of suitable tracers include, but are not limited to, halogenated organic acids, fluorinated compounds, radioisotopes, neutron emitters, dyes, heavy metals, mineral salts, and combinations thereof. These tracers are commonly detectable down to low concentrations ranging from parts per billion (ppb) to parts per trillion (ppt).

Figure 4A:
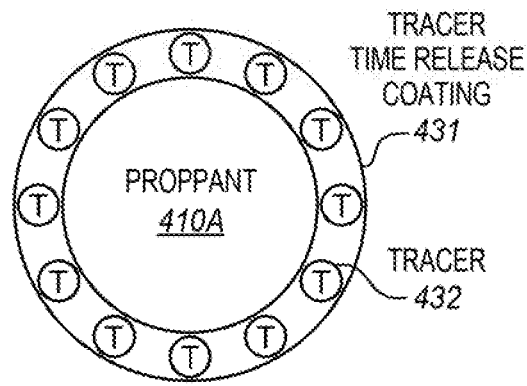
FIG. 4A illustrates an example embodiment of a proppant including a tracer time release coating.
Figure 4B:
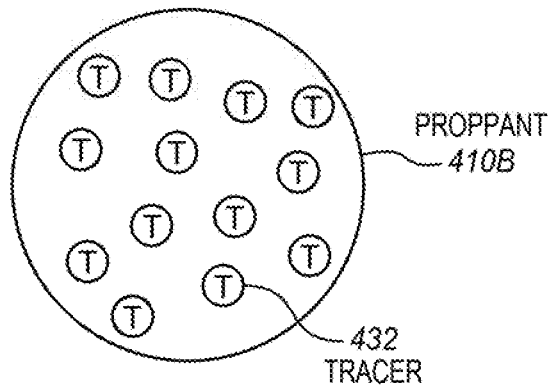
FIG. 4B illustrates an example embodiment of a proppant including a tracer (T) sorbed, solved, or otherwise contained within a bulk interior thereof.

In some embodiments, the tracer may be included on or in a time release proppant and the time release proppant may be operable to desorb or otherwise release the tracer over a period of time (e.g., typically ranging from at least several hours to many days). FIGS. 4A-4B illustrate two example embodiments of proppants that include a tracer (T) and that are operable to desorb or release the tracer. FIG. 4A illustrates a proppant 410A including a tracer time release coating 431. The tracer time release coating 431 has tracer (T) 432 sorbed, solved, or otherwise contained therein. The tracer may be released from the tracer time release coating over time (e.g., based on diffusion and/or permeability rates of the tracer through the time release coating). FIG. 4B illustrates a proppant 410B including a tracer (T) 432 sorbed, solved, or otherwise contained within a bulk interior thereof. The tracer may be released from the proppant over time (e.g., based on diffusion and/or permeability rates of the tracer through the proppant and/or dissolution of the proppant).

Figure 5:
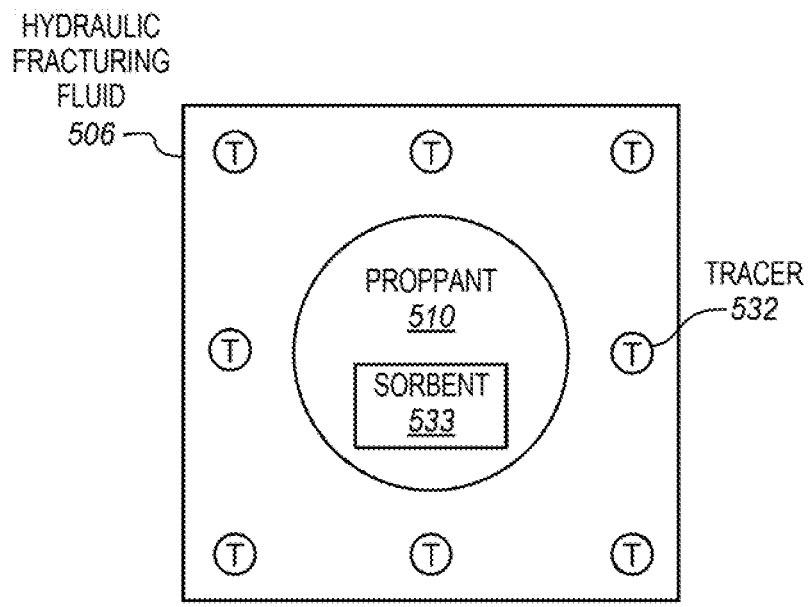
FIG. 5 illustrates an example embodiment of a hydraulic fracturing fluid that is to be initially introduced into a well and that includes tracer (T).

In other embodiments, the tracer may be included in a hydraulic fracturing fluid that is initially introduced into a well. FIG. 5 illustrates an example embodiment of a hydraulic fracturing fluid 506 that is to be initially introduced into a well and that includes tracer (T) 532. A proppant 510 is disposed within the hydraulic fracturing fluid 506. The proppant includes a sorbent 533 that is operable to sorb the tracer. The sorbent may be a coating, an integrated sorbent, or the entire proppant may be a sorbent. See e.g., FIGS. 7A-B.

Figure 6:
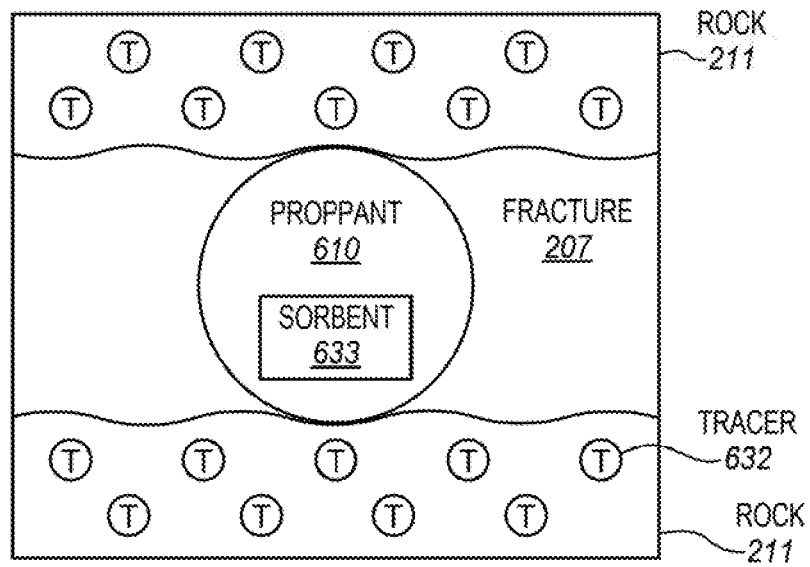
FIG. 6 illustrates subterranean rock defining a fracture that includes tracer (T).

In still other embodiments, the tracer may not be introduced into the subterranean formation through the well along with the hydraulic fracturing fluid and/or proppant, at block 321. For example, the tracer may be leached, extracted, dissolved, or otherwise derived from the subterranean formation. FIG. 6 illustrates an example embodiment of subterranean rock 211 defining a fracture 207 that includes tracer (T) 632. By way of example, the tracer may be a native tracer in the rock (e.g., a heavy metal, radioisotope, neutron emitter, mineral, salt, etc.) that may be dissolved or released into the hydraulic fracturing fluid. A proppant 610 is disposed within the fracture 207. The proppant includes a sorbent 633 that is operable to sorb the tracer. The sorbent may be a coating, an integrated sorbent, or the entire proppant may be a sorbent.

Figure 7A:
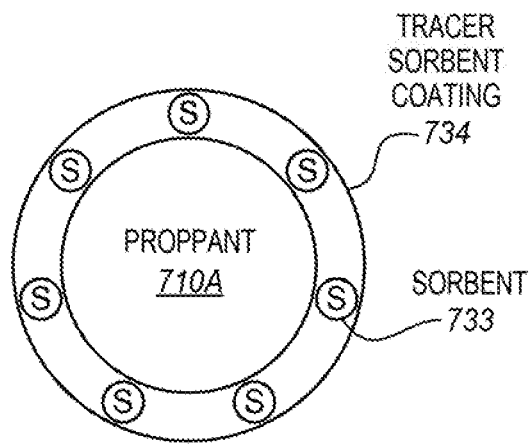
FIG. 7A illustrates an example embodiment of a proppant including a tracer sorbent (S) coating.
Figure 7B:
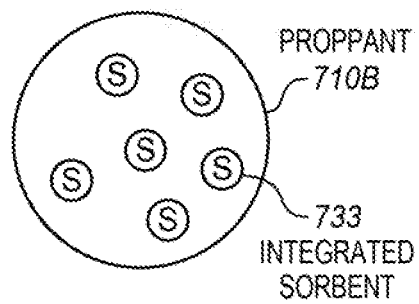
FIG. 7B illustrates an example embodiment of a proppant that is a sorbent (S) or that includes an integrated sorbent (S) within a bulk interior thereof.

Various different embodiments of proppant operable to sorb, retain, bind, or delay a tracer are contemplated. FIGS. 7A-7B illustrate two example embodiments of proppants that are operable to sorb, retain, bind, or delay a tracer (T). FIG. 7A illustrates a proppant 710A including a tracer sorbent coating 734. The tracer sorbent coating is or includes sorbent (S) 733. FIG. 7B illustrates a proppant 710B that is a sorbent (S) or that includes a sorbent (S) 733 within a bulk interior and/or exposed at an exterior thereof. The sorbent and/or proppant may sorb, retain, bind, or delay the tracer. In some cases, the proppant may be porous and/or permeable such that the tracer may be able to penetrate into the interior of the proppant to reach the sorbent. In other cases, at least some of the sorbent may be exposed at an exterior of the proppant.

Refer again to FIG. 3. Accordingly, at block 321, the hydraulic fracturing fluid including the proppant, and in some but not all embodiments a tracer, may be pumped, injected, or otherwise introduced into the subterranean formation through the well. As previously mentioned, the proppant is operable to sorb, retain, delay, bind, desorb, release, release over time, or otherwise relatively strongly physic-chemically interact with the tracer.

At block 322, samples of hydraulic fracturing fluid are recovered from the subterranean formation through the well over a period of time. In some embodiments, the samples may be taken periodically at appropriate intervals over substantially the entire time over which all or the majority of the hydraulic fracturing fluid is removed from the subterranean formation.

Concentrations of at least one tracer are analytically measured or determined in each of the samples, at block 323. In various embodiments, depending upon the particular type of tracer, the concentrations may be determined using various different types of quantitative chemical analysis equipment or approaches. For example, inductively coupled plasma mass spectrometers, ion chromatographs, spectrophotometers, e.g., spectra gamma detectors or gas chromatographs, might be used to measure tracer concentrations.

The concentrations of the at least one tracer in the samples are analyzed, at block 324, to assess placement of the proppant in the subterranean formation. The concentrations of the tracer in the analyzed samples depend upon and reflect both the interactions between the proppant and the tracer as well as the placement of the proppant within the subterranean formation. If desired, the approach may be combined with other approaches (e.g., seismic approaches, temperature approaches, etc.) to further understand the proppant placement, although this is not required.

Advantageously, the information about the proppant placement is useful for various different purposes. In some embodiments, the information about the proppant placement may be used, at least in part, to make, guide, or inform decisions about a contributing cause of a poorly producing well. For example, if the information indicates that the proppant has not been sufficiently placed (e.g., the proppant does not extend as far as desired from the wellbore), then this may guide a decision that the cause of the poorly producing well may be attributable to the insufficient placement of the proppant, as opposed to another reason (e.g., due to a lack of resources to be recovered from the pertinent region of the subterranean formation). This may additionally guide a decision that additional hydraulic fracturing or other stimulation or remedial action may be beneficial and/or should be performed in order to further stimulate the well (e.g., improve the placement of the proppant). Conversely, if the information indicates that the proppant has been sufficiently placed (e.g., on average the proppant extends a desired distance from the wellbore), then this may guide a decision that the cause of the poorly producing well may not be attributable to insufficient placement of the proppant, but rather may be attributable to another reason (e.g., due to a production decline or a lack of resources to be recovered from the pertinent region of the subterranean formation). This may additionally guide a decision that additional hydraulic fracturing may not be beneficial and/or should not be performed. Accordingly, knowledge of proppant placement, distribution, or geometry is useful to determine whether a poorly producing horizon is due to poor stimulation, or due to poor reservoir properties. As another example, in some embodiments, the information about the proppant placement may be used, at least in part, to make, guide, or inform decisions about changes to hydraulic fracturing procedures that may help to improve proppant placement.

Figure 8:
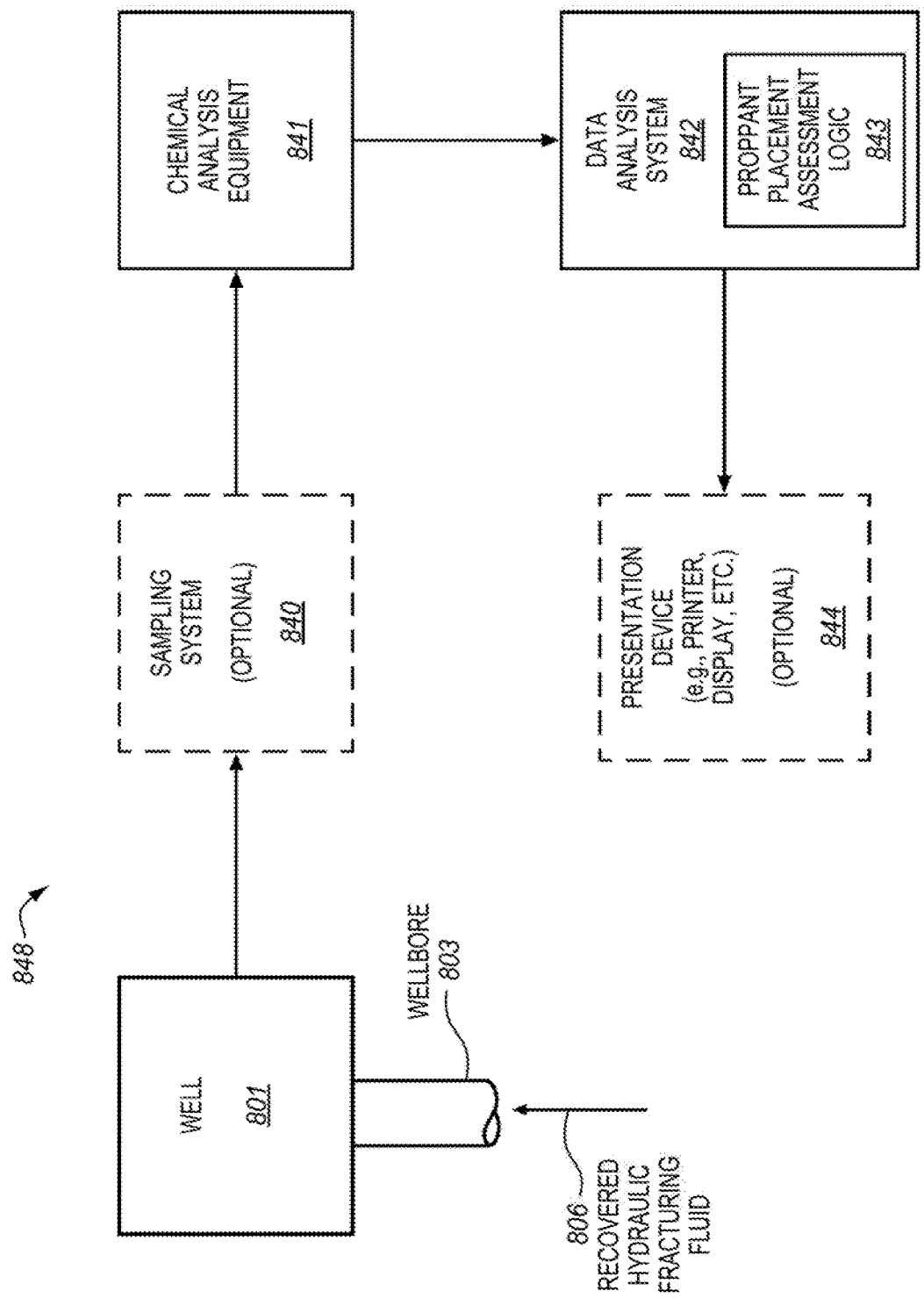
FIG. 8 is a block diagram of an example embodiment of a proppant placement assessment analysis system coupled to a well.

FIG. 8 is a block diagram of an example embodiment of a proppant placement assessment analysis system 848 coupled to a well 801. The system includes an optional sampling system 840, chemical analysis equipment 841, a data analysis system 842 having proppant placement assessment logic 843, and an optional presentation device 844.

The well is coupled to a wellbore 803. Hydraulic fracturing fluid, proppant, and in some embodiments tracer, may be introduced through the well down the wellbore and into an underground formation (not shown). Subsequently, hydraulic fracturing fluid 806 may be recovered through the wellbore and well.

The optional sampling system, which may represent an automated, mechanized sampling system, may be coupled with the well 801, as shown. Alternatively, the sampling system may be coupled with an above-surface pipe through which the recovered hydraulic fracturing fluid is conveyed to a storage tank or other storage. The optional sampling system 840 may periodically, at scheduled sampling times, or otherwise at appropriate times, sample the recovered hydraulic fracturing fluid 806. Alternatively, rather than such an automated or mechanized sampling system, sampling may be performed manually by operators.

An input of the chemical analysis equipment 841 is coupled with an output of the sampling system 840 to receive samples. Alternatively, samples may be manually input to the chemical analysis equipment. The chemical analysis equipment is operable to perform chemical analysis on the samples. For example, the chemical analysis equipment may quantitatively measure the concentration of tracer in the samples. Different chemical analysis systems are suitable for measuring concentrations of different types of tracers, as is well known in the art. The previously mentioned examples of chemical analysis equipment are suitable.

An input of a data analysis system is coupled with an output of the chemical analysis equipment to receive results of the chemical analysis performed on the samples (e.g., concentrations of tracer in the samples). In some embodiments, there may be a cable, network connection, physical connection or communication link, to couple the data analysis system with the chemical analysis equipment for the data analysis system to receive results from the chemical analysis equipment. Alternatively, the results may be transferred via files manually, via a database, etc. In some embodiments, the data analysis system may include a computer system or processing system. The computer system or processing system may have one or more processors (e.g., one or more general purpose microprocessors or central processing units), a memory, a motherboard, buses, etc. The computer system or processing system may be operable to perform data analysis. In some embodiments, the data analysis system may optionally include a mathematical co-processor or specialized model processing hardware. In some embodiments, the data analysis system may optionally, based on the analysis, control the chemical analysis equipment 841 and/or the sampling system 840.

The data analysis system includes proppant placement assessment logic 843. In some embodiments, the proppant placement assessment logic 843 may be used to perform the analysis at block 324 of FIG. 3. Alternatively, the proppant placement assessment logic 843 may be used to perform an entirely different analysis.

The proppant placement assessment logic may be operable to analyze the results of the chemical analysis performed on the samples (e.g., concentrations of at least one tracer in the samples). For example, the proppant placement assessment logic may be operable to analyze the results and/or concentrations to determine, estimate, evaluate, or otherwise assess proppant placement within the subterranean formation. The proppant placement assessment logic may include hardware (e.g., circuitry), firmware, software (e.g., sequences of computer instructions), or a combination thereof.

An optional presentation device 844 has an input that is coupled with an output of the data analysis system 842. The presentation device is operable to present results of the data analysis and/or proppant placement assessment/analysis to a user or other interconnected systems (e.g., other computer systems, databases, networks, etc.). In various embodiments, the presentation device may include a display or monitor, a printer, a network connection, a combination thereof, etc.

Tracer-proppant interactions (e.g., sorption, time release, etc.) may cause the concentrations of the tracer observed in the recovered samples to exhibit characteristic or distinctive attributes (e.g., lag times, curves, curve maximums, etc.). These characteristic or distinctive attributes (e.g., lag times, curves, curve maximums, curve shapes, curve areas, etc.) may also depend upon, and be altered by, different proppant placements. As a result, the characteristic or distinctive attributes (e.g., lag times, curves, curve maximums, etc.) incorporate and reflect information about proppant placement within the subterranean formation. A different curve, curve maximum, and/or lag time may be observed if proppant is packed tightly into a small region confined close to the wellbore (e.g., short fractures with tight proppant packing), as compared to a curve, curve maximum, and/or lag time that would be observed if proppant were instead distributed sparsely and significantly farther from the wellbore (e.g., long fractures with sparse proppant packing). Accordingly, in embodiments one or more of these characteristic or distinctive attributes may be generated from the concentration data collected, and may be used to assess proppant placement (e.g., representative proppant packing, representative fracture length, etc.).

Figure 9:
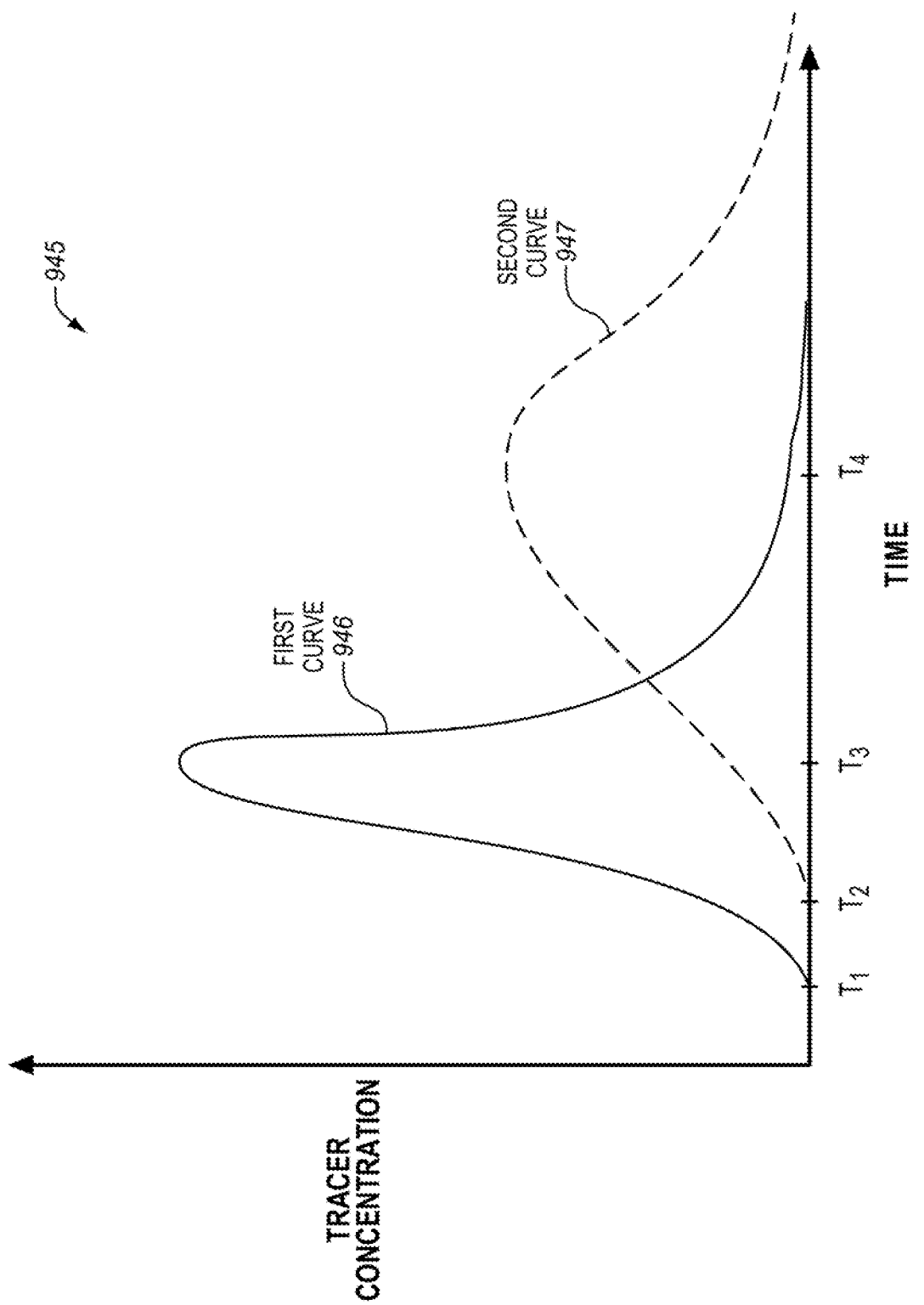
FIG. 9 is a graph illustrating example embodiments of curves representing tracer concentrations in samples of hydraulic fracturing fluid recovered at different times.

FIG. 9 is a graph 945 illustrating example embodiments of curves 946, 947 representing tracer concentrations in samples of hydraulic fracturing fluid recovered at different times. Time of sample recovery is plotted on the x-axis and concentration of tracer in the sample is plotted on the y-axis. A first curve 946 is shown in solid lines and a second curve 947 is shown in dashed lines. These curves may represent tracer breakthrough curves. The phrase "breakthrough curve" is also used in chromatography and other arts. The first curve exhibits characteristics representative of relatively poorer levels of proppant placement (e.g., the shorter proppant-containing fractures), whereas the second curve exhibits characteristics representative of relatively better levels of proppant placement (e.g., longer proppant-containing fractures). Each of the curves has different attributes (e.g., a different lag time, maximum concentration, curve shape, area beneath the curve, etc.). For example, a lag time of the first curve occurs at time T1, a maximum of the first curve occurs at a time T3, whereas a lag time of the second curve occurs at time T2, and a maximum of the second curve occurs at time T4.

As previously discussed, information about proppant placement, such as represented by a curve or curves similar to those shown in FIG. 9, may be used, at least in part, to make, guide, or inform decisions about a contributing cause of a poorly producing well. For example, if a curve such as the first curve is observed, indicating that proppant has not been sufficiently placed (e.g., the proppant does not extend as far as desired from the wellbore), then this may guide a decision that the cause of the poorly producing well may be attributable to the insufficient placement of the proppant, as opposed to another reason (e.g., due to a lack of resources to be recovered from the pertinent region of the subterranean formation). This may additionally guide a decision that additional hydraulic fracturing or other stimulation or remedial action may be beneficial and/or should be performed in order to further stimulate the well (e.g., improve the placement of the proppant). Conversely, if a curve such as the second curve is observed, indicating that proppant has been sufficiently placed (e.g., the proppant extends a desired or appropriate distance from the wellbore), then this may guide a decision that the cause of the poorly producing well may not be attributable to insufficient placement of the proppant, but rather may be attributable to another reason (e.g., due to a production decline or a lack of resources to be recovered from the pertinent region of the subterranean formation). This may additionally guide a decision that additional hydraulic fracturing may not be beneficial and/or should not be performed. Other uses are also contemplated, such as by providing feedback that may be used to improve hydraulic fracturing operations, knowing how far from existing wellbores to form new wellbores, etc.

In embodiments, different curves may be collected and compared in order to better interpret proppant placement from the curves. For example, different curves may be acquired for different hydraulically fractured regions of the same subterranean formation. As another example, different curves may be acquired for different but similar geologically subterranean regions. As yet another example, different curves acquired from or scaled up from laboratory, bench scale, or field pilot scale experiments may be acquired. As a still further example, different curves generated by models (e.g., simulation, theoretical, or semi-theoretical) may be acquired and used to better interpret proppant placement from the curves. If desired, field scale testing and/or underground mine back operations may be performed to collect real experimental data on actual proppant placement to better interpret proppant placement from the curves.

Figure 10:
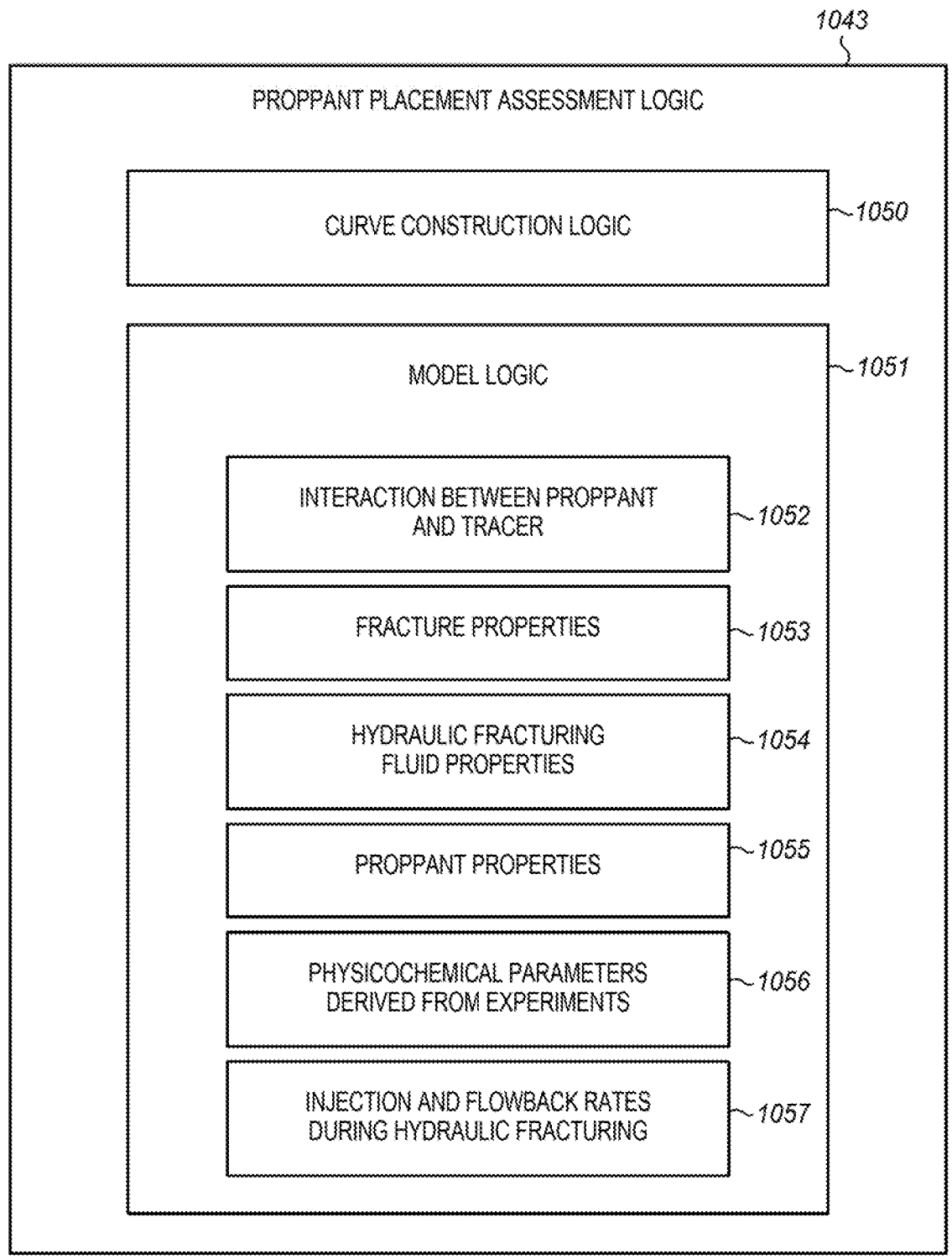
FIG. 10 is a block diagram of an example embodiment of proppant placement assessment logic.

FIG. 10 is a block diagram of an example embodiment of proppant placement assessment logic 1043. In some embodiments, the proppant placement assessment logic 1043 may be used as the proppant placement assessment logic 843 of the data analysis system 842 of FIG. 8 and/or to perform the analysis at block 324 of FIG. 3. Alternatively, the proppant placement assessment logic 1043 may be used in an entirely different data analysis system and/or may perform an entirely different analysis. The proppant placement assessment logic may be implemented in hardware, firmware, software, or a combination thereof.

The proppant placement assessment logic 1043 includes curve construction logic 1050. The curve construction logic may be a unit or module including hardware, firmware, software, or a combination thereof. The curve construction logic may be operable to construct a curve, such as, for example, those shown in FIG. 9. In some cases, the curve construction logic may be operable to determine attributes of the curve, such as, for example, lag times, maximums, areas under the curve, etc.

In the illustrated embodiment, the proppant placement assessment logic 1043 also includes model logic 1051. The model logic may be a unit or module including hardware, firmware, software, or a combination thereof. In various embodiments, the model logic may include theoretical, semi-theoretical, or semi-empirical model logic. The model logic may represent or model factors, including proppant placement, which affect tracer concentrations observed at the well. In some embodiments, the model logic may include equations, parameters, coefficients, distributions, statistical data, experimental data, or other model elements, that represent or model hydrogeochemical and/or fracture morphological factors, including proppant placement, which affect tracer concentrations observed at the well.

A wide variety of different types of model logics may be formulated by those skilled in the art based on various different assumptions, levels of sophistication, simplifications, levels of approximation, levels of theoretical versus empirical modeling, amount of empirical data available, etc. In the illustrated embodiment, the model logic includes a number of modeling elements 1052-1057. It will be appreciated that the illustrated modeling elements are illustrative, rather than limiting, and that other model logic may include fewer, more, or different modeling elements.

A first modeling element 1052 represents an interaction between proppant and tracer. The previous interactions (e.g., sorption, time release, etc.) are suitable. By way of example, the first modeling element may represent a sorption model (e.g., an equation with experimental or empirical coefficients specific to the tracer and proppant), a time release model (e.g., an equation with experimental or empirical coefficients specific to the tracer and proppant), etc.

A second modeling element 1053 represents fracture properties. By way of example, the second modeling element may represent a total, average, or representative amount of fracturing (e.g., a total amount of fracture volume, an average or representative fracture length, etc. In some cases, the second modeling element may represent three-dimensional (3D) fracture properties, fracture heterogeneity in aperture, fracture network connectivity, etc., although this is not required.

A third modeling element 1054 represents hydraulic fracturing fluid properties. For example, the composition, viscosity, density, flow-affecting characteristics, and other properties may be represented.

A fourth modeling element 1055 represents proppant properties. For example, size, size distribution, shape, density, weight, surface roughness, or other flow-affecting properties or properties that affect proppant placement by the hydraulic fracturing fluid may be represented.

A fifth modeling element 1056 represents physicochemical parameters derived from bench-scale or laboratory-scale experiments. For example, the physicochemical parameters may help to tune specific proppant-injectate physicochemical interactions, rock-connate fluid physicochemical properties, etc.

A sixth modeling element 1057 represents injection and flowback rates during hydraulic fracturing. For example, actual observed injection and flowback rates may be used.

As previously discussed, such model logic may be useful to help interpret curves for proppant placement. In some embodiments, this may be qualitative (e.g., by generally representing the change in shape of the curve for different levels of proppant placement). In other embodiments, the model logic may be theoretical model logic or semi-theoretical model logic that may be used to back out or estimate quantitatively parameters related to proppant placement.

The theoretical model logic or semi-theoretical model logic may include equations of a form that is based on, or based at least partly on, a scientific or theoretical explanation/basis for phenomenon expected to be encountered. The model logic may be regressed, fit, mathematically trained, mathematically compared, or otherwise compared to observed experimental data (e.g., a concentration versus time curve) in order to back out, derive, or estimate certain parameters, such as parameters associated with proppant placement.

In embodiments, multiple, different tracers may be used, such as, for example, to improve the analysis. In some embodiments, one or more of the multiple tracers may be a "blank" tracer that does not interact with the proppant or at least interacts significantly less with the proppant than one or more other non-blank tracers. Such a blank tracer(s) may provide a contrast to the non-blank tracer(s), which may provide additional information pertinent to retention of the non-blank tracers by the proppant. Moreover, in some embodiments, different tracers may be used in different stages or portions of hydraulic fracturing to help separate or isolate information about proppant placement in one stage or portion of the hydraulic fracturing from that of other stages or portions.

Figure 11:
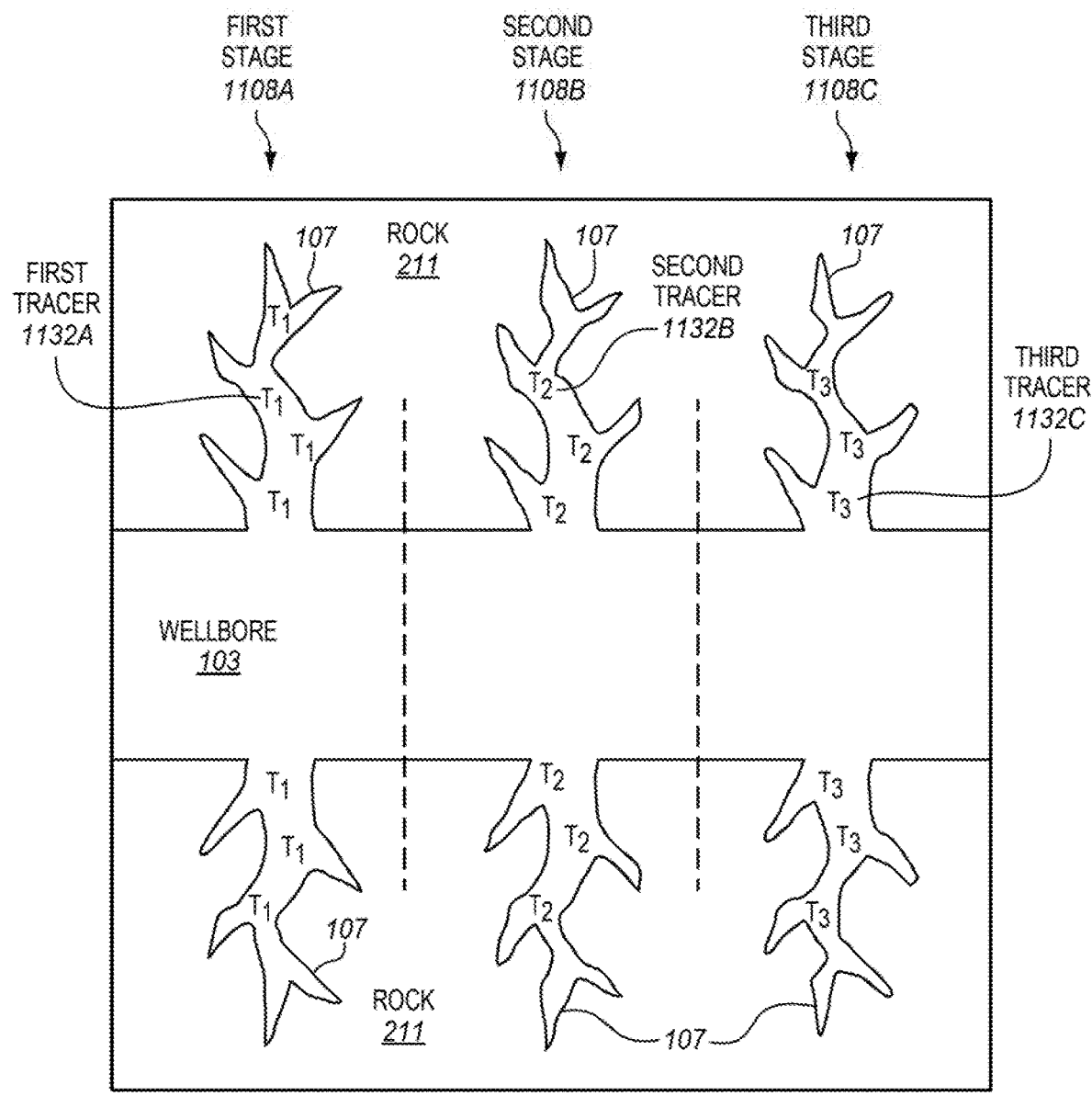
FIG. 11 is a cross-sectional side view of a portion of a wellbore and hydraulic fractures generated in different stages and illustrating an example embodiment of a use of different tracers for the different stages of the hydraulic fracturing.

FIG. 11 is a cross-sectional side view of a portion of a wellbore 103 and hydraulic fractures 107 generated in different stages 1108A, 1108B, 1108C and illustrating an example embodiment of a use of different tracers T1, T2, T3 for the different stages 1108A, 1108B, 1108C of the hydraulic fracturing.

As is known, hydraulic fracturing may be performed in different stages. For example, a plug and perf operation may be performed in which the location of fracturing along the length of the wellbore may be controlled by inserting composite plugs or bridge plugs below and above the region to be fractured. This may allow a wellbore to be progressively fractured along its length without hydraulic fracturing fluid entering previously fractured regions.

As shown in the illustration, fractures 107 have been created along a wellbore 103 in different stages. Three stages are shown in the illustration, including a first stage 1108A, a second stage 1108B, and a third stage 1108C, although fewer or more may be used instead. Different tracers are used in the different stages. In the example shown, a first tracer (T1) 1132-A is used in the first stage 1108A, a second, different tracer (T2) 1132-B is used in the second stage 1108B, and a third, different tracer (T3) 1132-C is used in the third stage 1108C. In some embodiments, the proppant within each of these stages may selectively interact with the corresponding tracer used for that stage, while not interacting (or at least interacting significantly less) with the tracers used for other stages. Analysis of the concentration of the first tracer (T1) 1132-A in samples of withdrawn hydraulic fracturing fluid may provide information about placement of proppant within the first stage 1108A. Likewise, analysis of the concentration of the second tracer (T2) 1132-B may provide information about placement of proppant within the second stage 1108B. Similarly, analysis of the concentration of the third tracer (T3) 1132-C may provide information about placement of proppant within the third stage 1108C. Advantageously, the analyzed concentrations of each tracer may provide information primarily about proppant placement within that tracer's corresponding stage independently, or at least more independently, of the proppant placement within other stages.

In other embodiments, multiple, different tracers may be used, to improve analysis in other ways. For example, multi-component transport profiles can be used to identify existing and/or aid in design of new proppant additives to amplify signals of proppant-injectate interaction, thereby increasing accuracy of proppant placement calculations. Other uses of multiple tracers will be apparent to those skilled in the art and having the benefit of the present disclosure.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known circuits, structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

Various operations and methods have been described. Some of the methods have been described in a basic form in the flow diagrams, but operations may optionally be added to and/or removed from the methods.

One or more embodiments include an article of manufacture (e.g., a computer program product) that includes a machine-accessible and/or machine-readable medium. The medium may include a mechanism that provides, for example stores, information in a form that is accessible and/or readable by the machine. The machine-accessible and/or machine-readable medium may provide, or have stored thereon, one or more or a sequence of instructions and/or data structures that if executed by a machine causes or results in the machine performing, and/or causes the machine to perform, one or more or a portion of the operations or methods or the techniques shown in the figures disclosed herein.

In one embodiment, the machine-readable medium may include a tangible non-transitory machine-readable storage media or device. For example, the tangible non-transitory machine-readable storage media may include a floppy diskette, an optical storage medium, an optical disk, a CD-ROM, a magnetic disk, a magneto-optical disk, a read only memory (ROM), a programmable ROM (PROM), an erasable-and-programmable ROM (EPROM), an electrically-erasable-and-programmable ROM (EEPROM), a random-access memory (RAM), a static-RAM (SRAM), a dynamic-RAM (DRAM), a Flash memory, a phase-change memory, or a combination thereof. The tangible medium may include one or more solid or tangible physical materials, such as, for example, a semiconductor material, a phase change material, a magnetic material, etc.

Examples of suitable machines include, but are not limited to, computer systems, desktops, laptops, servers, workstations, supercomputers, etc. Such electronic devices typically include one or more processors coupled with one or more other components, such as one or more storage devices (non-transitory machine-readable storage media), user input/output devices (e.g., a keyboard, a touchscreen, and/or a display), and/or network connections. The coupling of the processors and other components is typically through one or more busses and bridges (also termed bus controllers). Thus, the storage device of a given electronic device may store code and/or data for execution on the one or more processors of that electronic device. Alternatively, one or more parts of an embodiment of the invention may be implemented using different combinations of software, firmware, and/or hardware.

It should also be appreciated that reference throughout this specification to "one embodiment," "an embodiment," or "one or more embodiments," for example, means that a particular feature may be included in the practice of the invention. Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A system comprising:
    a hydraulic fracturing fluid injection system for injecting a hydraulic fracturing fluid into a subterranean formation, the hydraulic fracturing fluid comprising a proppant capable of sorbing a tracer that is naturally occurring in the subterranean formation and released into the hydraulic fracturing fluid upon contact with hydraulic fracturing fluid;
    chemical analysis equipment to receive and analyze samples of hydraulic fracturing fluid recovered from the subterranean formation taken at different times for concentrations of the tracer in the recovered hydraulic fracturing fluid by at least one quantitative chemical analysis machine; and
    a data analysis system coupled with the chemical analysis equipment, the data analysis system including proppant placement assessment logic, the proppant placement assessment logic operable to analyze the concentrations of the tracer to assess placement of the proppant in a subterranean formation;
    wherein the proppant placement assessment logic includes curve generation logic that is operable to generate a curve for a given tracer of the at least one tracer, the curve showing concentrations of the given tracer in the samples as a function of time.

2. The system of claim 1, wherein the proppant placement assessment logic includes model logic including model elements operable to represent hydrogeochemical and fracture morphological factors that affect the placement of the proppant.

3. The system of claim 2, wherein the proppant placement assessment logic is operable to compare the concentrations of the at least one tracer in the samples with estimated concentrations of the model logic to train the model logic to determine a parameter of the model logic associated with the placement of the proppant.

4. The system of claim 1, wherein the proppant placement assessment logic is operable to analyze concentrations of a plurality of different tracers, each introduced into a different hydraulic fracturing stage, to assess the placement of the proppant.

5. An article of manufacture for determining proppant placement in a subterranean formation, comprising:
    a tangible, non-transitory machine-readable medium storing instructions that when executed result in a machine performing operations including,
    analyzing concentrations of at least one tracer that is naturally occurring in the subterranean formation and released into a hydraulic fracturing fluid containing a proppant capable of sorbing the at least one tracer upon contact with hydraulic fracturing fluid in samples of recovered hydraulic fracturing fluid taken at different times to assess placement of the proppant in the subterranean formation, and
    determining adjustments to proppant placement in the subterranean formation based on the concentration analysis,
    wherein said analyzing includes analyzing the concentrations of the at least one tracer in the samples with a model that includes model elements to represent hydrogeochemical and fracture morphological factors that determine the placement of the proppant in the subterranean formation; and
    wherein the tangible machine-readable medium further stores instructions that if executed result in the machine performing operations including generating a curve for a given tracer of the at least one tracer, the curve showing concentrations of the given tracer in the samples as a function of time.

6. The article of manufacture of claim 5, wherein the tangible machine-readable medium further stores instructions that if executed result in the machine performing operations including,
    comparing the concentrations of the at least one tracer in the samples with estimated concentrations of the model to determine a parameter of the model associated with the placement of the proppant.

* * * * *